(12) United States Patent
Banine et al.

(10) Patent No.: US 7,465,943 B2
(45) Date of Patent: Dec. 16, 2008

(54) CONTROLLING THE FLOW THROUGH THE COLLECTOR DURING CLEANING

(75) Inventors: Vadim Yevgenyevich Banine, Helmond (NL); Sonia Margart Skelly, Veldhoven (NL); Derk Jan Wilfred Klunder, Geldrop (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 130 days.

(21) Appl. No.: 11/296,701

(22) Filed: Dec. 8, 2005

(65) Prior Publication Data

US 2007/0131878 A1 Jun. 14, 2007

(51) Int. Cl.
*G21K 5/00* (2006.01)
(52) U.S. Cl. .............. 250/492.2; 250/503.1; 250/504 R; 378/34
(58) Field of Classification Search .............. 250/492.2, 250/503.1, 504; 378/34
See application file for complete search history.

(56) References Cited

U.S. PATENT DOCUMENTS

| | | | | |
|---|---|---|---|---|
| 4,665,315 A * | 5/1987 | Bacchetti et al. ......... 250/492.1 |
| 5,711,507 A * | 1/1998 | Berget et al. ........... 251/129.04 |
| 6,566,668 B2 * | 5/2003 | Rauch et al. ............ 250/504 R |
| 6,683,936 B2 * | 1/2004 | Jonkers ........................ 378/34 |
| 6,753,941 B2 * | 6/2004 | Visser .......................... 355/30 |
| 7,233,010 B2 * | 6/2007 | Van Herpen et al. ...... 250/492.2 |
| 2003/0095623 A1 * | 5/2003 | Singer et al. ................... 378/34 |
| 2004/0109151 A1 * | 6/2004 | Bakker et al. ................. 355/69 |
| 2004/0165160 A1 * | 8/2004 | Van Beek et al. ............. 355/30 |
| 2004/0183031 A1 * | 9/2004 | Silverman et al. ........ 250/492.2 |
| 2005/0122491 A1 * | 6/2005 | Bakker et al. ................. 355/30 |
| 2006/0286820 A1 * | 12/2006 | Singh et al. ................. 438/792 |
| 2007/0023706 A1 * | 2/2007 | Sjmaenok et al. ....... 250/504 R |
| 2007/0085043 A1 * | 4/2007 | Leonardus Franken et al. ... 250/504 R |

* cited by examiner

*Primary Examiner*—Jack I Berman
*Assistant Examiner*—Michael Maskell
(74) *Attorney, Agent, or Firm*—Pillsbury Winthrop Shaw Pittman, LLP

(57) ABSTRACT

A lithographic apparatus includes a collector configured to collect radiation from a radiation source, the collector including a plurality of shells forming separate compartments, and a cleaning arrangement including a gas inlet and a gas outlet, the cleaning arrangement being configured to clean surfaces of the plurality of shells by guiding a gas flow from the inlet through the compartments to the outlet. The cleaning arrangement includes a distribution system configured to divide the gas flow into several sub flows, each of the sub flows corresponding to one or more of the compartments, and a control system configured to control the relative amount of the sub flows.

23 Claims, 4 Drawing Sheets

CONTROLLING THE FLOW THROUGH THE COLLECTOR DURING CLEANING

BACKGROUND OF THE INVENTION

1. Field of the Invention

The present invention relates to a lithographic apparatus and a method of cleaning a collector included in such a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In some current designs for lithographic apparatus, radiation in the EUV range (with wavelengths typically of 5-20 nm) is used to transfer a pattern from a mask onto a substrate. Radiation produced by an EUV light source is collected by a EUV collector and then directed into an illumination system. When an EUV source based on Sn is used, it will also produce Sn particles that may contaminate the EUV collector. In order to achieve sufficient lifetime for the lithography apparatus, it is required that these Sn particles are removed from the EUV collector mirror (this will be referred to as 'cleaning').

Currently there are two methods available for removing these Sn contaminations. In recent experiments, it has been demonstrated that with hydrogen radicals (or a mixture of hydrogen with another gas) it is possible to remove Sn contaminations from a substrate. Another possible method is halogen cleaning. In this method halogens form a volatile Sn-halogen molecule, which evaporates and is transported out of the collector with a gas flow. Besides the Sn contamination, the collector may be contaminated with Sn-oxides. In order to remove the Sn-oxides as well, they first need to be reduced to Sn. This is done using hydrogen radicals.

Both these cleaning methods require hydrogen radicals and therefore implementation of hydrogen radicals in the EUV collector is very important. One of the requirements for efficiently cleaning a collector surface is a sufficiently large flux of hydrogen radicals on the collector surface. A large flux may be achieved at a relatively high pressure but at very high pressures hydrogen radicals are quickly lost due to three-body recombination. At low pressures the radicals are quickly lost due to recombination on wall surfaces. A possible pressure range wherein a sufficiently high flux can be established and wherein recombination of radicals is limited, is at pressures above 10 kPa. At these pressures, a high velocity flow through the collector is needed in order to clean the whole collector. However, the velocity achievable is limited by the maximum pumping capacity of the system.

SUMMARY OF THE INVENTION

It is desirable to provide a method of cleaning a collector of an EUV lithographic apparatus using hydrogen radicals wherein a sufficiently high velocity of the hydrogen radicals is achieved with a limited pumping capacity.

Accordingly, there is provided a lithographic apparatus including a collector configured to collect radiation from a radiation source, the collector including a plurality of shells forming separate compartments; a cleaning arrangement including a gas inlet and a gas outlet, the arrangement being configured to clean surfaces of the plurality of shells by guiding a gas flow from the inlet through the compartments to the outlet, wherein the cleaning arrangement includes a distribution system configured to divide the gas flow into several sub flows, each of the sub flows corresponding to one or more of the compartments, and a control system configured to control the relative amount of the sub flows.

According to yet another aspect, there is provided a cleaning arrangement including a gas inlet and a gas outlet, the arrangement being configured to clean surfaces of shells of a collector of a lithographic apparatus by guiding a gas flow from the inlet through compartments of said collector to the outlet, wherein the cleaning arrangement includes a distribution system configured to divide the gas flow into several sub flows, each of the sub flows corresponding to one or more of the compartments, and a control system configured to control the relative amount of the sub flows.

According to another aspect of the invention, there is provided a method of cleaning a collector of a lithographic apparatus, the collector including a plurality of collector shells forming separate compartments configured to receive radiation at a first open end of the collector and to deliver radiation at a second open end of the collector, wherein the method include guiding a gas flow through the compartments in order to clean surfaces of the plurality of shells; dividing the gas flow into several sub flows, each of the sub flows corresponding to one of the compartments; and controlling the relative amount of the sub flows.

According to another aspect of the invention, there is provided a collector for a lithographic apparatus, the collector including a plurality of tubular shells forming separate compartments, and cross walls extending in radial direction and subdividing the compartments.

Throughout the text unless indicated otherwise, the terms "hydrogen" and "hydrogen radicals" include their isotopes as well, in particular, deuterium and tritium.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
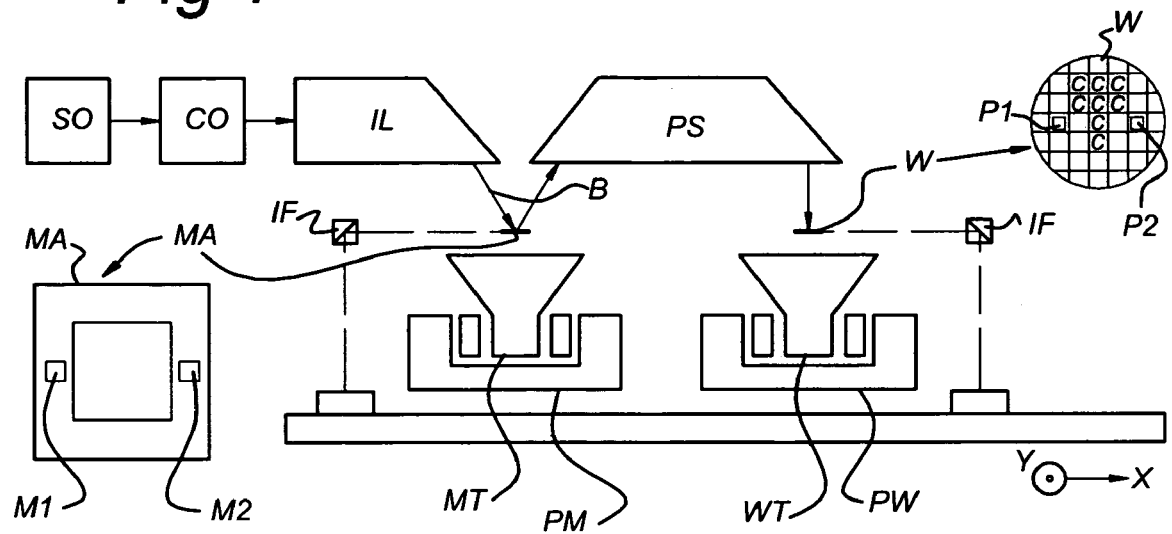
FIG. 1 depicts a lithographic apparatus according to an embodiment of the invention.

FIG. 1 schematically depicts a lithographic apparatus according to one embodiment of the invention. The apparatus includes a collector CO configured to collect radiation from a radiation source SO. An illumination system (illuminator) IL is configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a collector CO which receives radiation from the radiation source SO. The source SO and the lithographic apparatus may be separate entities, for example when the source is an excimer laser. In such cases, the radiation beam may be passed from the source SO via the collector CO to the illuminator IL with the aid of a beam delivery system BD including, for example, suitable directing mirrors and/or a beam expander. In other cases the source may be an integral part of the lithographic apparatus, for example when the source is a mercury lamp. The source SO, the collector CO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser. The illuminator IL may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 (e.g. an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
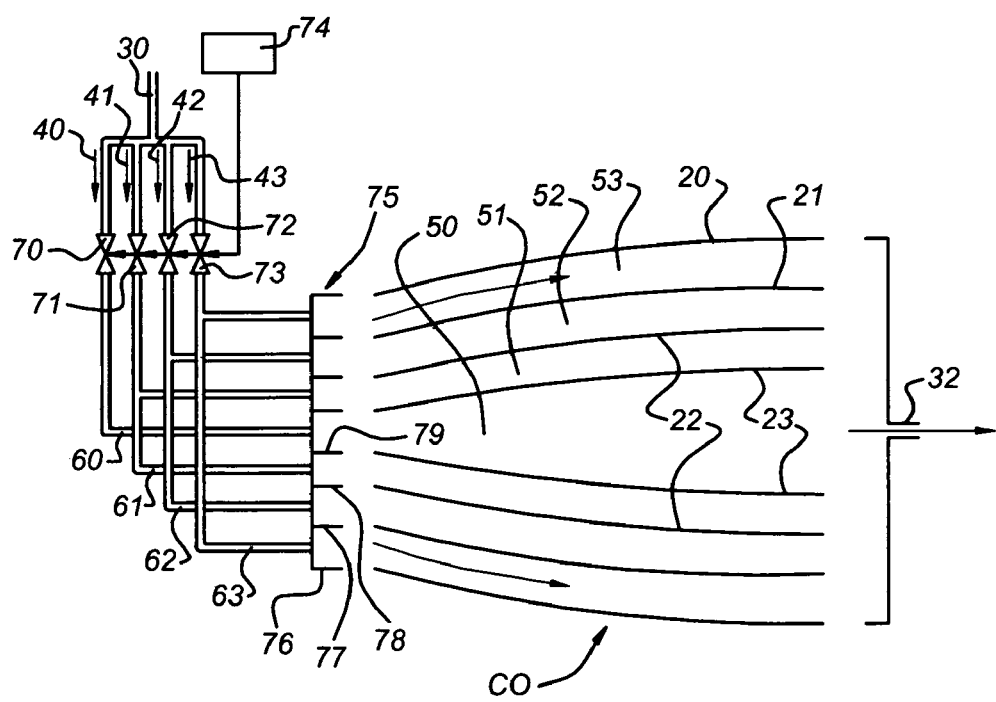
FIG. 2 depicts part of the lithographic apparatus according to an embodiment of the invention.

Referring to FIG. 2, the collector CO includes a plurality of coaxial shells 20, 21, 22, 23 forming separate compartments 50, 51, 52, 53. A cleaning arrangement includes a gas inlet 30 and a gas outlet 32, and is configured to clean surfaces of the plurality of shells 20-23 by guiding a gas flow from the inlet 30 through the compartments 50, 51, 52, 53 to the outlet 32. The cleaning arrangement further includes a distribution system configured to divide the gas flow into several sub flows 40, 41, 42, 43, each of said sub flows corresponding to one of the compartments 50, 51, 52, 53 respectively. In an embodiment, the shells 20-23 are substantially tubular concentric walls so as to form substantially tubular compartments 50, 51, 52, 53, see FIG. 2. FIG. 2 shows an embodiment wherein the distribution system includes tubes 60, 61, 62, 63 configured to direct the respective sub flows 40, 41, 42, 43 into the different compartments 50, 51, 52, 53 respectively. In this embodiment, the distribution system further includes a cap 75 which is configured to close an entrance of the collector CO. The tubes 60-63 are connected to the cap 75, in a way which will be discussed below with reference to FIGS. 3 and 4. As can be seen from FIG. 2, the cap 75 includes rings 76, 77, 78, 79 which meet the circular outer ends of the shells 20-23.

The lithographic apparatus includes a control system configured to control the relative amount of the sub flows 40, 41, 42, 43. The control system includes a plurality of valves 70, 71, 72, 73 for controlling the sub flows 40, 41, 42, 43 respectively. The control system further includes a control unit 74 that is configured to control the valves 70, 71, 72, 73 depending on predefined conditions. The control unit 74 may, for example, be a computer including memory to store instructions and a processor to execute instructions. By controlling the valves 70, 71, 72, 73, it is possible to, for example, clean each of the compartments 50, 51, 52, 53 of the collector CO separately. As shown in FIG. 2, the valve 73 is open and the other valves, i.e. valves 70, 71, 72 are closed.

Because these compartments are smaller than the complete collector volume, they need a relatively low flow rate to create sufficient velocity of the cleaning gas and therefore the pumping capacity does not need to be as high.

Figure 3:
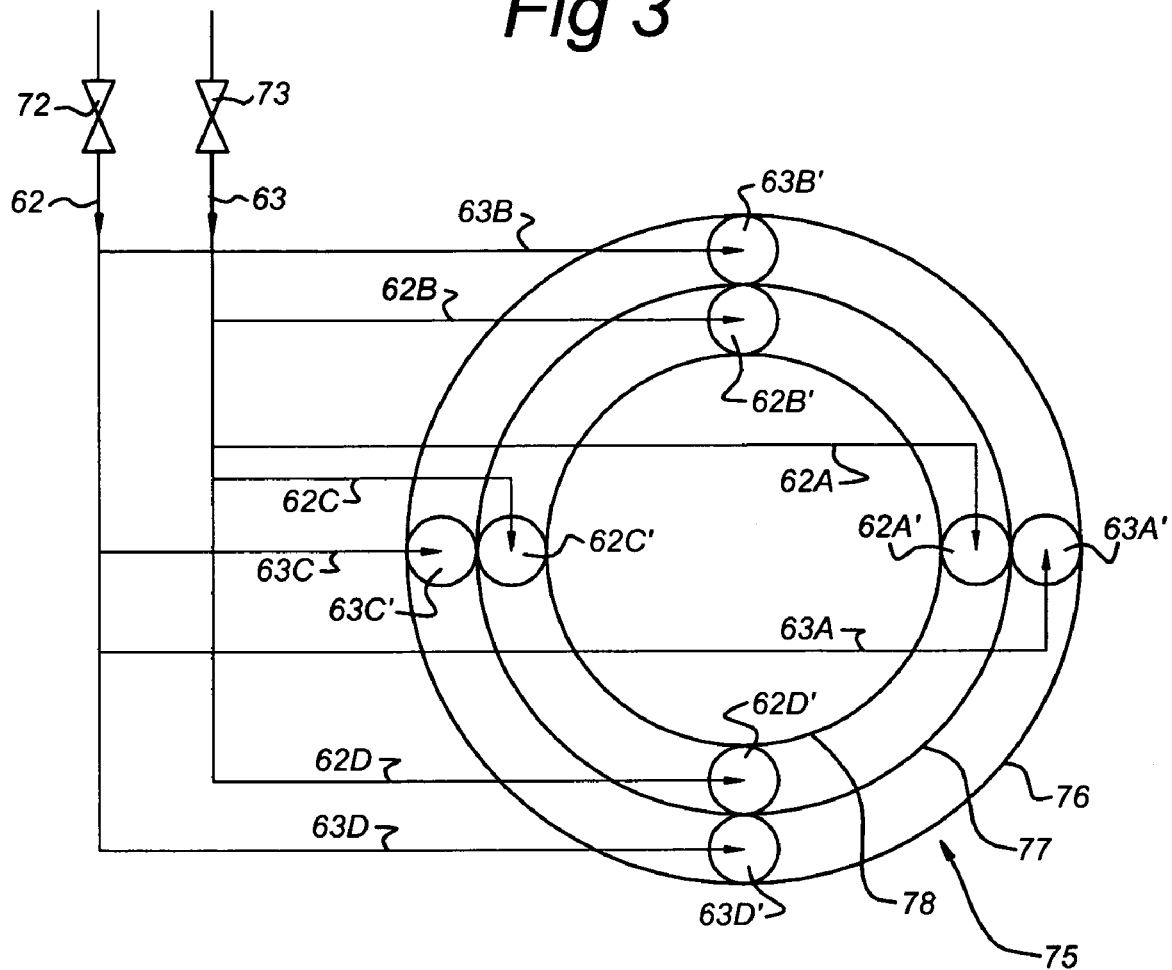
FIG. 3 depicts a front view of a cap connected to two tubes.
Figure 4:
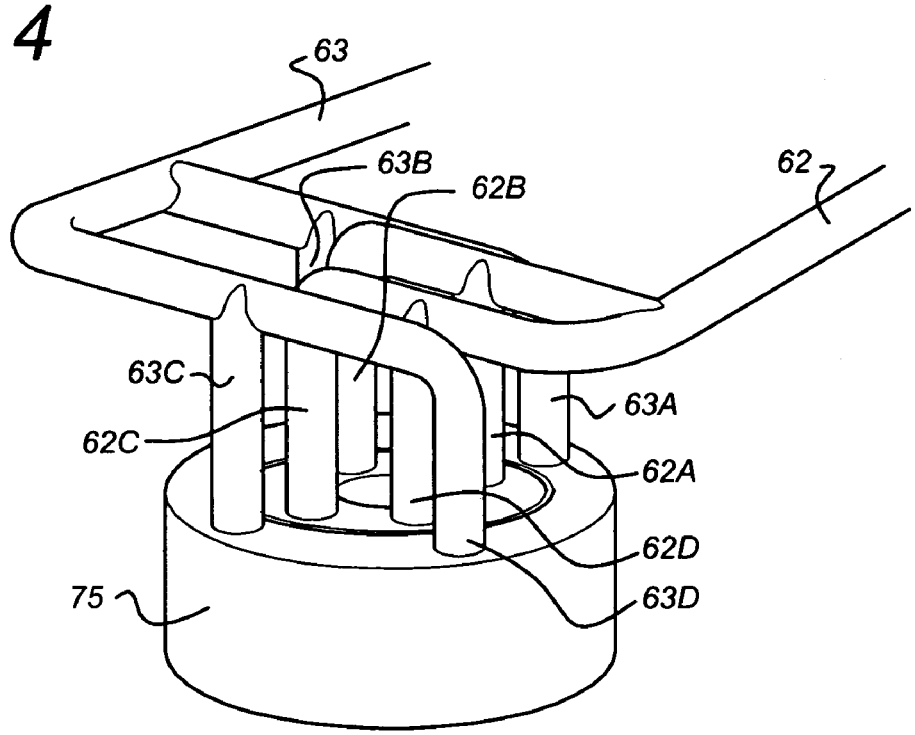
FIG. 4 depicts a perspective view of a distribution system.

FIG. 3 is a schematic front view of the cap 75. For reasons of simplicity only two tubes 62, 63 are shown. As was explained above, the sub flow 42 flowing through tube 62 is controlled by valve 72 and the sub flow 43 flowing through tube 63 is controlled by valve 73. Both tubes 62 and 63 are split up into four end tubes. In this example, tube 62 is split up into end tubes 62A, 62B, 62C and 62D, and tube 63 is split up into end tubes 63A, 63B, 63C and 63D. FIG. 3 shows a possible configuration on how the end tubes 62A, 62B, 62C, 62D, 63A, 63B, 63C, 63D can be connected to the cap 75. Outlets of the end tubes 62A, 62B, 62C, 62D, 63A, 63B, 63C, 63D are depicted by circles 62A', 62B', 62C', 62D', 63A', 63B', 63C', 63D'. FIG. 3 further shows the rings 76, 77, 78 of the cap 75. The further distribution of the sub flows 42 and 43 into four sub flows results in a better distribution of the sub flows in the respective compartments 52, 53. FIG. 4 is a perspective view of a possible arrangement of the distribution system showing the tubes 62, 63 and the end tubes 62A-62D, 63A-63D connected to the cap 75.

Figure 5:
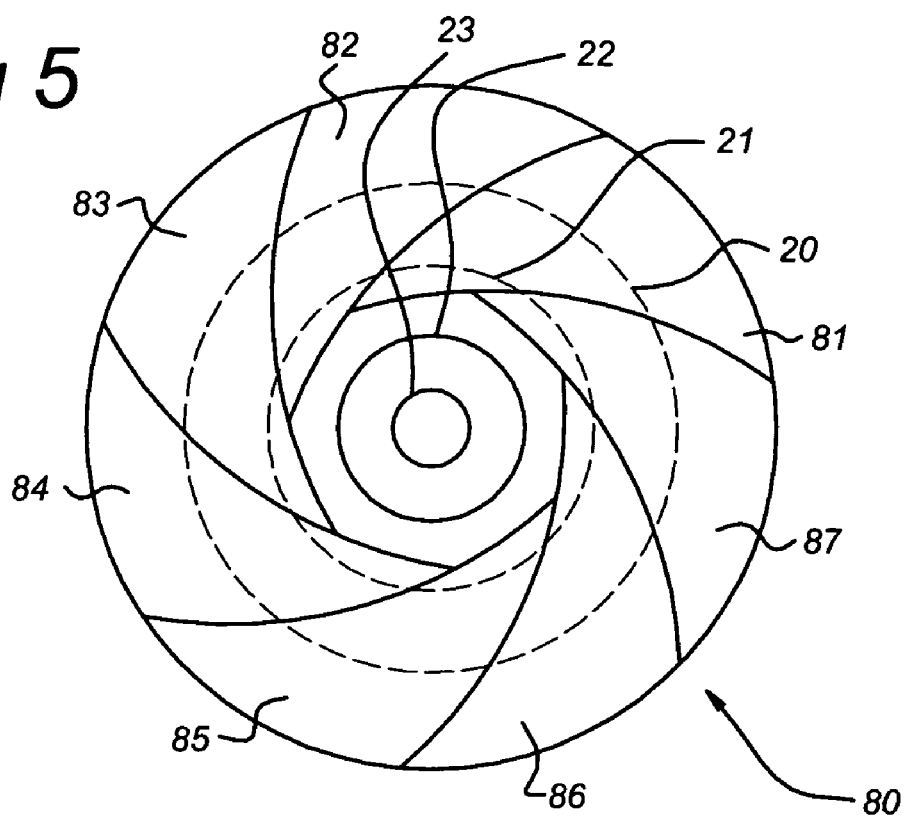
FIG. 5 depicts an embodiment of the invention including a control system that includes a diaphragm.

Referring to FIG. 5, the control system includes a diaphragm 80 having diaphragm blades 81, 82, 83, 84, 85, 86, 87. The diaphragm 80 is placed at the entrance of the collector CO so as to obstruct at least part of the openings of at least some of the compartments 50, 51, 52, 53. The diaphragm 80 can be opened and closed depending on the control parameters which may be defined to control the relative amount of the sub flows through the compartments 50, 51, 52, 53. In FIG. 5, the shells 22 and 23 of the collector CO are visible and depicted as circles. Because of the particular aperture of the diaphragm 80, the shells 20, 21 are not visible in FIG. 5. They are depicted in FIG. 5 by dashed circles. The diaphragm 80 may obstruct for example only the outer compartment 53 so as to let the cleaning gas flow through compartments 50, 51 and 52. It should be appreciated that other configurations are possible. During cleaning of the collector CO, the diaphragm 80 can dynamically be controlled so as to obstruct different parts of the collector opening at different moments in time.

Figure 6:
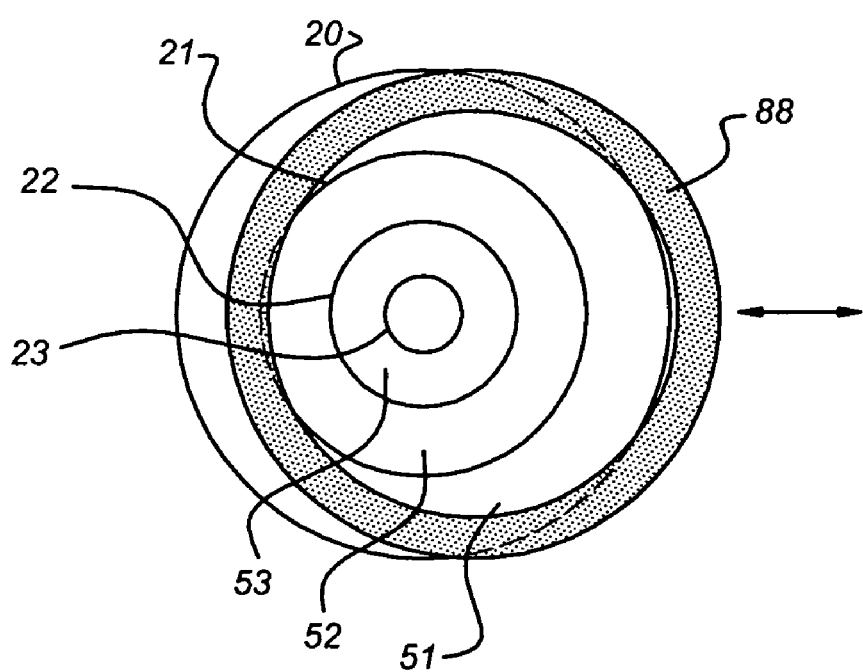
FIG. 6 depicts an embodiment of the invention including a control system that includes a ring.

Referring to FIG. 6, the control system includes a ring 88 which may be moved in front of the entrance or exit of the collector CO. FIG. 6 shows the ring 88 during a transition from a non-obstructive state to an obstructive state in which the ring 88 will close part of the entrance of compartment 53. The ring 88 can be moved depending on the control parameters which may be defined to control the relative amount of the sub flows through the compartment 53. By reducing the opening of the largest entrance (i.e. the entrance of compartment 53) the flow-resistance of the compartment 53 is increased. This results in a relatively larger flow-resistance of compartment 53 as compared to the other compartments 50, 51, 52. And in turn, this results in a better distribution of the gas flow through all the compartments 50, 51, 52, 53 of the collector CO. It should be appreciated that the ring 88 could also be a static ring positioned in front of one or more of the compartments. To prevent the ring 88 from obstructing the radiation, the ring 88 may be positioned in front of the outer compartment 53 and outside the radiation beam coming from the radiation source SO.

Figure 7:
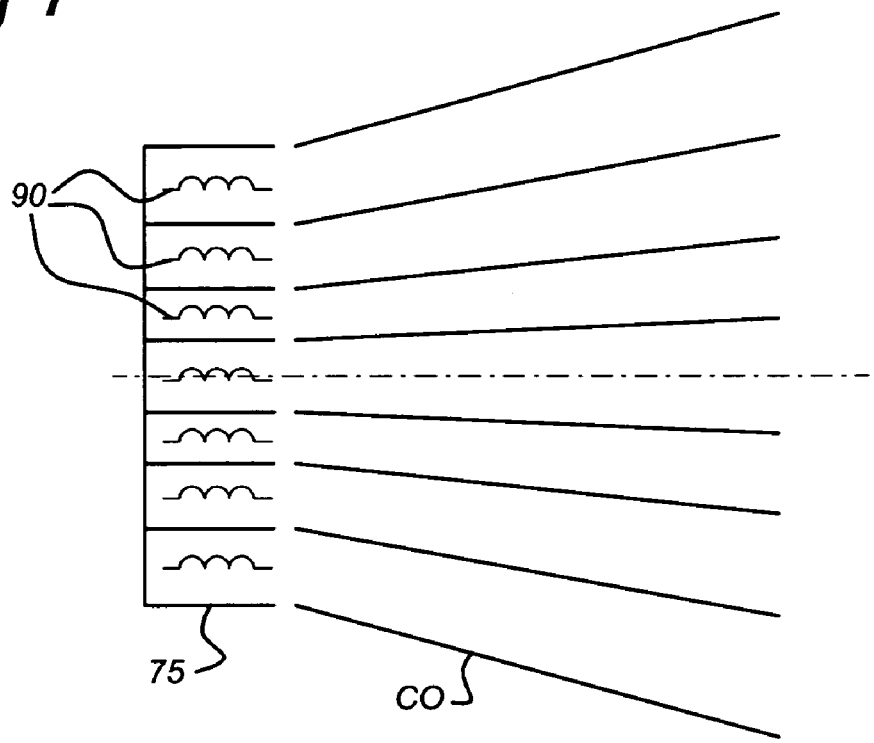
FIG. 7 depicts a configuration wherein filaments are positioned in a cap.

The collector CO may be cleaned using a cleaning gas which includes H radicals. The lithographic apparatus may include a H radical source at the entrance of each compartment 50, 51, 52, 53. Referring to FIG. 7, filaments 90 are positioned in the cap 75. The filaments are heated by a current and will produce H radicals when a gas containing $H_2$ is pumped through the cap 75. Producing the H radicals at the entrance of the compartments 50, 51, 52, 53 results in a local production of H radicals and therefore a loss of H radicals in the tubes is avoided.

Figure 8:
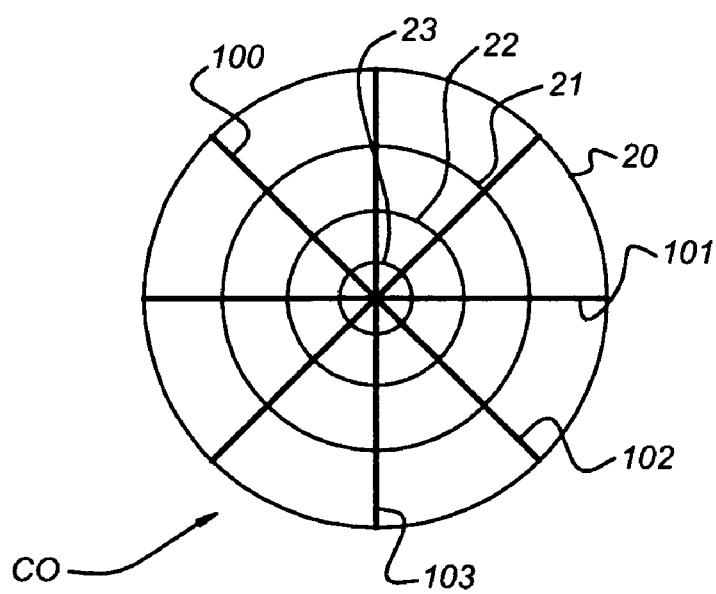
FIG. 8 depicts a cross-section of the collector with tubular shells and cross walls.

Referring to FIG. 8, the collector CO includes a plurality of substantially tubular shells 20, 21, 22, 23 forming separate compartments 50, 51, 52, 53. The collector CO includes cross walls 100, 101, 102, 103 extending in radial direction and subdividing the compartments 50, 51, 52, 53. By subdividing the compartments 50, 51, 52, 53, more sub flows can be defined which flow through even smaller sub compartments. When cleaning only some of the sub compartments at a time, a further reduction of the pump capacity needed is possible.

It should be noted that instead of placing the distribution system and the control system at the upstream side of the collector CO (i.e. the side facing the source SO), it is also possible to place the distribution system and the control system at the downstream side of the collector (i.e. the side facing the illuminator IL). It should be appreciated that the distribution system including the cap 75 and the tubes 60, 61, 62, 63 can be combined with the control system including the diaphragm 80. It should also be appreciated that it is possible to place the distribution system described with reference to FIG. 2 at the upstream side of the collector CO and the diaphragm 80 shown in FIG. 5 at the down stream side of the collector.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. For example, the diaphragm 80 or the ring 88 may be placed inside (for example half way in) the collector CO instead of at the entrance or exit. It will be apparent to one skilled in the art that such modifications may be made to the invention as described without departing from the scope of the claims set out below.

What is claimed is:

1. A lithographic apparatus, comprising:
   a collector configured to collect radiation from a radiation source, said collector comprising a plurality of shells forming separate compartments; and
   a cleaning arrangement configured, during use, to be removably arranged at a position adjacent to an entrance or an exit of the collector and comprising a gas inlet and a gas outlet, said arrangement being configured to clean surfaces of said plurality of shells by guiding a gas flow from said inlet through said compartments to said outlet, wherein said cleaning arrangement comprises:
   a distribution system configured to divide said gas flow into several sub flows, each of said sub flows corresponding to one or more of said compartments, and
   a control system configured to control the relative amount of each of said sub flows.

2. A lithographic apparatus according to claim 1, wherein said control system further comprises valves configured to control said sub flows.

3. A lithographic apparatus according to claim 1, wherein said control system further comprises a diaphragm, said diaphragm being configured to control one of said sub flows.

4. A lithographic apparatus according to claim 1, wherein said control system further comprises a ring configured to control at least part of one of said sub flows.

5. A lithographic apparatus according to claim 1, wherein said distribution system comprises tubes configured to direct said sub flows into the compartments.

6. A lithographic apparatus according to claim 1, wherein said gas comprises H radicals.

7. A lithographic apparatus according to claim 1, wherein said cleaning arrangement comprises a H radical source at an entrance of each compartment.

8. A lithographic apparatus according to claim 1, wherein said collector comprises a plurality of substantially tubular shells forming separate compartments, and said collector further comprises cross walls extending in a radial direction and subdividing said compartments.

9. A lithographic apparatus according to claim 1, wherein the distribution system is provided on one of an upstream side or a downstream side of the collector.

10. A lithographic apparatus according to claim 1, wherein the gas inlet and the gas outlet are provided on opposite ends of the collector.

11. A lithographic apparatus according to claim 1, wherein the gas flow is guided from said inlet through said compartments to said outlet so that the gas flows between opposite ends of the collector.

12. A lithographic apparatus, comprising:
  a collector configured to collect radiation from a radiation source, said collector comprising a plurality of shells forming separate compartments;
  an illumination system configured to condition a radiation beam;
  a support configured to support a patterning device, the patterning device being configured to impart the radiation beam with a pattern in its cross-section to form a patterned radiation beam;
  a substrate table configured to hold a substrate;
  a projection system configured to project the patterned radiation beam onto a target portion of the substrate; and
  a cleaning arrangement configured, during use, to be removably arranged at a position adjacent to an entrance or an exit of the collector and comprising a gas inlet and a gas outlet, said cleaning arrangement being configured to clean surfaces of said plurality of shells by guiding a gas flow from said inlet through said compartments to said outlet, wherein said cleaning arrangement further comprises:
  a distribution system configured to divide said gas flow into several sub flows, each of said sub flows corresponding to one or more of said compartments, and
  a control system configured to control the relative amount of each of said sub flows.

13. A lithographic apparatus according to claim 12, further comprising an EUV radiation source.

14. A lithographic apparatus according to claim 13, wherein said EUV source is a Sn source.

15. A lithographic apparatus according to claim 12, wherein the distribution system is provided on one of an upstream side or a downstream side of the collector.

16. A lithographic apparatus according to claim 12, wherein the gas inlet and the gas outlet are provided on opposite ends of the collector.

17. A collector for a lithographic apparatus, said collector comprising a plurality of substantially tubular shells forming separate compartments each compartment being configured to guide a gas flow through said collector, wherein said collector further comprises cross walls extending fully between adjacent shells in a radial direction and subdividing said compartments, wherein at least one compartment extends substantially radially to a center of the collector.

18. A cleaning arrangement comprising a gas inlet and a gas outlet, said cleaning arrangement configured, during use, to be removably arranged at a position adjacent an entrance or an exit of a collector of a lithographic apparatus and being configured to clean surfaces of shells of the collector by guiding a gas flow from said inlet through compartments of said collector to said outlet, wherein said cleaning arrangement further comprises:
  a distribution system configured to divide said gas flow into several sub flows, each of said sub flows corresponding to one or more of said compartments; and
  a control system configured to control the relative amount of each of said sub flows.

19. A cleaning arrangement according to claim 18, wherein the distribution system is provided on one of an upstream side or a downstream side of the collector.

20. A method of cleaning a collector of a lithographic apparatus, said collector comprising a plurality of collector shells forming separate compartments configured to receive radiation at a first open end of said collector and to deliver radiation at a second open end of said collector, said method comprising:
  removably arranging a cleaning arrangement at a position adjacent an entrance or an exit of the collector, the cleaning arrangement configured to provide a gas flow;
  guiding the gas flow through said compartments in order to clean surfaces of said plurality of shells;
  dividing said gas flow into several sub flows, each of said sub flows corresponding to one of said compartments; and
  controlling the relative amount of each of said sub flows.

21. A method of cleaning a collector according to claim 20, wherein said compartments are divided into sub compartments by cross walls extending in a radial direction and crossing said shells.

22. A method of cleaning a collector according to claim 20, wherein the cleaning arrangement comprises a gas inlet that is provided on one of the first end or second end of the collector.

23. A cleaning arrangement according to claim 19, wherein the gas inlet and the gas outlet are provided on opposite ends of the collector.

* * * * *